(12) United States Patent
Perezselsky et al.

(10) Patent No.: US 8,716,613 B2
(45) Date of Patent: May 6, 2014

(54) APPARATUS AND METHOD FOR ELECTROSTATIC DISCHARGE PROTECTION

(75) Inventors: Armando Leon Perezselsky, Mesa, AZ (US); Richard Brian Nelson, Chandler, AZ (US)

(73) Assignee: Synaptics Incoporated, San Jose, CA (US)

( * ) Notice: Subject to any disclaimer, the term of this patent is extended or adjusted under 35 U.S.C. 154(b) by 952 days.

(21) Appl. No.: 12/716,122

(22) Filed: Mar. 2, 2010

(65) Prior Publication Data

US 2011/0214924 A1   Sep. 8, 2011

(51) Int. Cl.
*G06F 3/041*   (2006.01)

(52) U.S. Cl.
USPC .......................................... 178/18.03; 382/124

(58) Field of Classification Search
USPC ................. 178/18.03; 174/257, 262; 382/124
See application file for complete search history.

(56) References Cited

U.S. PATENT DOCUMENTS

| | | |
|---|---|---|
| 3,593,319 A | 7/1971 | Barber |
| 4,151,512 A | 4/1979 | Rigannati et al. |
| 4,225,850 A | 9/1980 | Chang et al. |
| 4,310,827 A | 1/1982 | Asai |
| 4,353,056 A | 10/1982 | Tsikos |
| 4,405,829 A | 9/1983 | Rivest et al. |
| 4,525,859 A | 6/1985 | Bowles et al. |
| 4,550,221 A | 10/1985 | Mabusth |
| 4,580,790 A | 4/1986 | Doose |
| 4,582,985 A | 4/1986 | Lofberg |
| 4,675,544 A | 6/1987 | Shrenk |
| 4,758,622 A | 7/1988 | Gosselin |
| 4,817,183 A | 3/1989 | Sparrow |
| 5,076,566 A | 12/1991 | Kriegel |
| 5,079,949 A | 1/1992 | Tamori |
| 5,109,427 A | 4/1992 | Yang |

(Continued)

FOREIGN PATENT DOCUMENTS

| | | |
|---|---|---|
| DE | 2213813 A1 | 10/1973 |
| EP | 0791899 A2 | 8/1997 |

(Continued)

OTHER PUBLICATIONS

Matsumoto et al., Impact of Artificial "Gummy" Fingers on Fingerprint Systesm, SPIE 4677 (2002), reprinted from cryptome.org.

(Continued)

*Primary Examiner* — Kevin M Nguyen
*Assistant Examiner* — Kenneth B Lee, Jr.
(74) *Attorney, Agent, or Firm* — Shartsis Friese LLP; Cecily Anne O'Regan; William C. Cray

(57) ABSTRACT

Embodiments of the invention provide a substrate and a method for constructing a substrate with electrostatic discharge protection. The substrate includes an edge surface with at least one plated castellation capable of conducting electrostatic discharge. The at least one plated castellation is connected to a circuit trace on at least one of the bottom surface and the top surface of the substrate. The method includes punching holes along at least a portion of a perimeter of each of a plurality of substrates in a substrate array, plating the holes with a conductive material, and cutting each of the plurality of substrates along cut lines that bisect at least some of the holes.

20 Claims, 6 Drawing Sheets

(56) References Cited

U.S. PATENT DOCUMENTS

| | | |
|---|---|---|
| 5,140,642 A | 8/1992 | Hsu et al. |
| 5,270,949 A | 12/1993 | Atherton et al. |
| 5,305,017 A | 4/1994 | Gerpheide |
| 5,319,323 A | 6/1994 | Fong |
| 5,325,442 A | 6/1994 | Knapp |
| 5,359,243 A | 10/1994 | Norman |
| 5,420,936 A | 5/1995 | Fitzpatrick et al. |
| 5,422,807 A | 6/1995 | Mitra et al. |
| 5,429,006 A | 7/1995 | Tamori |
| 5,456,256 A | 10/1995 | Schneider et al. |
| 5,515,738 A | 5/1996 | Tamori |
| 5,543,591 A | 8/1996 | Gillespie et al. |
| 5,569,901 A | 10/1996 | Bridgelall et al. |
| 5,623,552 A | 4/1997 | Lane |
| 5,627,316 A | 5/1997 | De Winter et al. |
| 5,650,842 A | 7/1997 | Maase et al. |
| 5,717,777 A | 2/1998 | Wong et al. |
| 5,781,651 A | 7/1998 | Hsiao et al. |
| 5,801,681 A | 9/1998 | Sayag |
| 5,818,956 A | 10/1998 | Tuli |
| 5,828,773 A | 10/1998 | Setlak et al. |
| 5,838,306 A | 11/1998 | O'Connor |
| 5,844,287 A | 12/1998 | Hassan et al. |
| 5,848,176 A | 12/1998 | Hara et al. |
| 5,850,450 A | 12/1998 | Schweitzer et al. |
| 5,852,670 A | 12/1998 | Setlak et al. |
| 5,864,296 A | 1/1999 | Upton |
| 5,887,343 A | 3/1999 | Salatino et al. |
| 5,892,824 A | 4/1999 | Beatson et al. |
| 5,903,225 A | 5/1999 | Schmitt et al. |
| 5,915,757 A | 6/1999 | Tsuyama et al. |
| 5,920,384 A | 7/1999 | Borza |
| 5,920,640 A | 7/1999 | Salatino et al. |
| 5,940,526 A | 8/1999 | Setlak et al. |
| 5,963,679 A * | 10/1999 | Setlak .......................... 382/312 |
| 5,995,630 A | 11/1999 | Borza |
| 5,999,637 A | 12/1999 | Toyoda et al. |
| 6,002,389 A | 12/1999 | Kasser |
| 6,002,815 A | 12/1999 | Immega et al. |
| 6,011,859 A | 1/2000 | Kalnitsky et al. |
| 6,016,355 A | 1/2000 | Dickinson et al. |
| 6,052,475 A | 4/2000 | Upton |
| 6,067,368 A | 5/2000 | Setlak et al. |
| 6,073,343 A | 6/2000 | Petrick et al. |
| 6,076,566 A | 6/2000 | Lowe |
| 6,088,585 A | 7/2000 | Schmitt et al. |
| 6,098,175 A | 8/2000 | Lee |
| 6,118,318 A | 9/2000 | Fifield et al. |
| 6,134,340 A | 10/2000 | Hsu et al. |
| 6,157,722 A | 12/2000 | Lerner et al. |
| 6,161,213 A | 12/2000 | Lofstrom |
| 6,175,407 B1 | 1/2001 | Santor |
| 6,182,076 B1 | 1/2001 | Yu et al. |
| 6,182,892 B1 | 2/2001 | Angelo et al. |
| 6,185,318 B1 | 2/2001 | Jain et al. |
| 6,234,031 B1 | 5/2001 | Suga |
| 6,241,288 B1 | 6/2001 | Bergenek et al. |
| 6,259,108 B1 | 7/2001 | Antonelli et al. |
| 6,289,114 B1 | 9/2001 | Mainguet |
| 6,292,272 B1 | 9/2001 | Okauchi et al. |
| 6,317,508 B1 | 11/2001 | Kramer et al. |
| 6,320,394 B1 | 11/2001 | Tartagni |
| 6,325,285 B1 | 12/2001 | Baratelli |
| 6,327,376 B1 | 12/2001 | Harkin |
| 6,330,345 B1 | 12/2001 | Russo et al. |
| 6,332,193 B1 | 12/2001 | Glass et al. |
| 6,333,989 B1 | 12/2001 | Borza |
| 6,337,919 B1 | 1/2002 | Duton |
| 6,343,162 B1 | 1/2002 | Saito et al. |
| 6,346,739 B1 | 2/2002 | Lepert et al. |
| 6,347,040 B1 | 2/2002 | Fries et al. |
| 6,357,663 B1 | 3/2002 | Takahashi et al. |
| 6,360,004 B1 | 3/2002 | Akizuki |
| 6,362,633 B1 | 3/2002 | Tartagni |
| 6,392,636 B1 | 5/2002 | Ferrari et al. |
| 6,399,994 B2 | 6/2002 | Shobu |
| 6,400,836 B2 | 6/2002 | Senior |
| 6,408,087 B1 | 6/2002 | Kramer |
| 6,459,804 B2 | 10/2002 | Mainguet |
| 6,473,072 B1 | 10/2002 | Comiskey et al. |
| 6,481,294 B2 | 11/2002 | Zellner et al. |
| 6,509,501 B1 | 1/2003 | Eicken et al. |
| 6,512,381 B2 | 1/2003 | Kramer |
| 6,525,547 B2 | 2/2003 | Hayes |
| 6,525,932 B1 | 2/2003 | Ohnishi et al. |
| 6,535,622 B1 | 3/2003 | Russo et al. |
| 6,539,101 B1 | 3/2003 | Black |
| 6,546,122 B1 | 4/2003 | Russo |
| 6,580,816 B2 | 6/2003 | Kramer et al. |
| 6,597,289 B2 | 7/2003 | Sabatini |
| 6,628,812 B1 | 9/2003 | Setlak et al. |
| 6,631,201 B1 | 10/2003 | Dickinson et al. |
| 6,643,389 B1 | 11/2003 | Raynal et al. |
| 6,672,174 B2 | 1/2004 | Deconde et al. |
| 6,710,461 B2 | 3/2004 | Chou et al. |
| 6,738,050 B2 | 5/2004 | Comiskey et al. |
| 6,741,729 B2 | 5/2004 | Bjorn et al. |
| 6,757,002 B1 | 6/2004 | Oross et al. |
| 6,766,040 B1 | 7/2004 | Catalano et al. |
| 6,785,407 B1 | 8/2004 | Tschudi et al. |
| 6,799,275 B1 | 9/2004 | Bjorn |
| 6,836,230 B2 | 12/2004 | Le Pailleur et al. |
| 6,838,905 B1 | 1/2005 | Doyle |
| 6,862,942 B2 | 3/2005 | Kawahata |
| 6,873,356 B1 | 3/2005 | Kanbe et al. |
| 6,886,104 B1 | 4/2005 | McClurg et al. |
| 6,897,002 B2 | 5/2005 | Teraoka et al. |
| 6,898,299 B1 | 5/2005 | Brooks |
| 6,924,496 B2 | 8/2005 | Manansala |
| 6,937,748 B1 | 8/2005 | Schneider et al. |
| 6,941,001 B1 | 9/2005 | Bolle et al. |
| 6,941,810 B2 | 9/2005 | Okada |
| 6,950,540 B2 | 9/2005 | Higuchi |
| 6,959,874 B2 | 11/2005 | Bardwell |
| 6,963,626 B1 | 11/2005 | Shaeffer et al. |
| 6,970,584 B2 | 11/2005 | O'Gorman et al. |
| 6,980,672 B2 | 12/2005 | Saito et al. |
| 6,983,882 B2 | 1/2006 | Cassone |
| 7,013,030 B2 | 3/2006 | Wong et al. |
| 7,020,591 B1 | 3/2006 | Wei et al. |
| 7,030,860 B1 | 4/2006 | Hsu et al. |
| 7,031,670 B2 | 4/2006 | May |
| 7,035,443 B2 | 4/2006 | Wong |
| 7,042,535 B2 | 5/2006 | Katoh et al. |
| 7,043,061 B2 | 5/2006 | Hamid et al. |
| 7,043,644 B2 | 5/2006 | DeBruine |
| 7,046,230 B2 | 5/2006 | Zadesky et al. |
| 7,064,743 B2 | 6/2006 | Nishikawa |
| 7,099,496 B2 | 8/2006 | Benkley, III |
| 7,110,574 B2 | 9/2006 | Haruki et al. |
| 7,110,577 B1 | 9/2006 | Tschud |
| 7,113,622 B2 | 9/2006 | Hamid |
| 7,126,389 B1 | 10/2006 | McRae et al. |
| 7,129,926 B2 | 10/2006 | Mathiassen et al. |
| 7,136,514 B1 | 11/2006 | Wong |
| 7,146,024 B2 | 12/2006 | Benkley |
| 7,146,026 B2 | 12/2006 | Russon et al. |
| 7,146,029 B2 | 12/2006 | Manansala |
| 7,184,581 B2 | 2/2007 | Johansen et al. |
| 7,190,209 B2 | 3/2007 | Kang et al. |
| 7,190,816 B2 | 3/2007 | Mitsuyu et al. |
| 7,194,392 B2 | 3/2007 | Tuken et al. |
| 7,197,168 B2 | 3/2007 | Russo |
| 7,200,250 B2 | 4/2007 | Chou |
| 7,251,351 B2 | 7/2007 | Mathiassen et al. |
| 7,258,279 B2 | 8/2007 | Schneider et al. |
| 7,260,246 B2 | 8/2007 | Fujii |
| 7,263,212 B2 | 8/2007 | Kawabe |
| 7,263,213 B2 | 8/2007 | Rowe |
| 7,289,649 B1 | 10/2007 | Walley et al. |
| 7,290,323 B2 | 11/2007 | Deconde et al. |
| 7,308,122 B2 | 12/2007 | McClurg et al. |
| 7,321,672 B2 | 1/2008 | Sasaki et al. |
| 7,356,169 B2 | 4/2008 | Hamid |

(56) References Cited

U.S. PATENT DOCUMENTS

| | | | |
|---|---|---|---|
| 7,360,688 | B1 | 4/2008 | Harris |
| 7,369,685 | B2 | 5/2008 | DeLeon |
| 7,379,569 | B2 | 5/2008 | Chikazawa et al. |
| 7,408,135 | B2 | 8/2008 | Fujeda |
| 7,409,876 | B2 | 8/2008 | Ganapathi et al. |
| 7,412,083 | B2 | 8/2008 | Takahashi |
| 7,424,618 | B2 | 9/2008 | Roy et al. |
| 7,447,339 | B2 | 11/2008 | Mimura et al. |
| 7,447,911 | B2 | 11/2008 | Chou et al. |
| 7,460,697 | B2 | 12/2008 | Erhart et al. |
| 7,463,756 | B2 | 12/2008 | Benkley, III |
| 7,474,772 | B2 | 1/2009 | Russo et al. |
| 7,505,611 | B2 | 3/2009 | Fyke |
| 7,505,613 | B2 | 3/2009 | Russo |
| 7,565,548 | B2 | 7/2009 | Fiske et al. |
| 7,574,022 | B2 | 8/2009 | Russo |
| 7,596,832 | B2 | 10/2009 | Hsieh et al. |
| 7,599,530 | B2 | 10/2009 | Boshra |
| 7,616,787 | B2 | 11/2009 | Boshra |
| 7,634,117 | B2 | 12/2009 | Cho |
| 7,643,950 | B1 | 1/2010 | Getzin et al. |
| 7,646,897 | B2 | 1/2010 | Fyke |
| 7,681,232 | B2 | 3/2010 | Nordentoft et al. |
| 7,689,013 | B2 | 3/2010 | Shinzaki |
| 7,706,581 | B2 | 4/2010 | Drews et al. |
| 7,733,697 | B2 | 6/2010 | Picca et al. |
| 7,734,074 | B2 | 6/2010 | Setlak et al. |
| 7,751,601 | B2 | 7/2010 | Benkley |
| 7,826,645 | B1 | 11/2010 | Cayen |
| 7,843,438 | B2 | 11/2010 | Onoda |
| 7,848,798 | B2 | 12/2010 | Martinsen et al. |
| 7,899,216 | B2 | 3/2011 | Watanabe et al. |
| 7,953,258 | B2 | 5/2011 | Dean et al. |
| 8,005,276 | B2 | 8/2011 | Dean et al. |
| 8,031,916 | B2 | 10/2011 | Abiko et al. |
| 8,063,734 | B2 | 11/2011 | Conforti |
| 8,077,935 | B2 | 12/2011 | Geoffroy et al. |
| 8,107,212 | B2 | 1/2012 | Nelson et al. |
| 8,116,540 | B2 | 2/2012 | Dean et al. |
| 8,131,026 | B2 | 3/2012 | Benkley et al. |
| 8,165,355 | B2 | 4/2012 | Benkley et al. |
| 8,175,345 | B2 | 5/2012 | Gardner |
| 8,204,281 | B2 | 6/2012 | Satya et al. |
| 8,224,044 | B2 | 7/2012 | Benkley |
| 8,229,184 | B2 | 7/2012 | Benkley |
| 8,276,816 | B2 | 10/2012 | Gardner |
| 8,278,946 | B2 | 10/2012 | Thompson |
| 8,290,150 | B2 | 10/2012 | Erhart et al. |
| 8,315,444 | B2 | 11/2012 | Gardner |
| 8,331,096 | B2 | 12/2012 | Garcia |
| 8,358,815 | B2 | 1/2013 | Benkley et al. |
| 8,374,407 | B2 | 2/2013 | Benkley et al. |
| 8,391,568 | B2 | 3/2013 | Satyan |
| 8,447,077 | B2 | 5/2013 | Benkley et al. |
| RE44,440 | E | 8/2013 | Getzin et al. |
| 8,520,913 | B2 | 8/2013 | Dean et al. |
| 2001/0026636 | A1 | 10/2001 | Mainget |
| 2001/0030644 | A1 | 10/2001 | Allport |
| 2001/0036299 | A1 | 11/2001 | Senior |
| 2001/0043728 | A1 | 11/2001 | Kramer et al. |
| 2002/0014530 | A1 | 2/2002 | Iihama |
| 2002/0025062 | A1 | 2/2002 | Black |
| 2002/0061125 | A1 | 5/2002 | Fujii |
| 2002/0064892 | A1 | 5/2002 | Lepert et al. |
| 2002/0067845 | A1 | 6/2002 | Griffis |
| 2002/0073046 | A1 | 6/2002 | David |
| 2002/0089044 | A1 | 7/2002 | Simmons et al. |
| 2002/0089410 | A1 | 7/2002 | Janiak et al. |
| 2002/0096731 | A1 | 7/2002 | Wu et al. |
| 2002/0122026 | A1 | 9/2002 | Bergstrom |
| 2002/0126516 | A1 | 9/2002 | Jeon |
| 2002/0133725 | A1 | 9/2002 | Roy et al. |
| 2002/0152048 | A1 | 10/2002 | Hayes |
| 2002/0181749 | A1 | 12/2002 | Matsumoto et al. |
| 2003/0002717 | A1 | 1/2003 | Hamid |
| 2003/0002719 | A1 | 1/2003 | Hamid et al. |
| 2003/0021495 | A1 | 1/2003 | Cheng |
| 2003/0035570 | A1 | 2/2003 | Benkley |
| 2003/0063782 | A1 | 4/2003 | Acharya et al. |
| 2003/0068072 | A1 | 4/2003 | Hamid |
| 2003/0076301 | A1 | 4/2003 | Tsuk et al. |
| 2003/0076303 | A1 | 4/2003 | Huppi |
| 2003/0095096 | A1 | 5/2003 | Robbin et al. |
| 2003/0095690 | A1 | 5/2003 | Su et al. |
| 2003/0102874 | A1 | 6/2003 | Lane et al. |
| 2003/0123714 | A1 | 7/2003 | O'Gorman et al. |
| 2003/0141959 | A1 | 7/2003 | Keogh et al. |
| 2003/0147015 | A1 | 8/2003 | Katoh et al. |
| 2003/0161510 | A1 | 8/2003 | Fuji |
| 2003/0161512 | A1 | 8/2003 | Mathiassen et al. |
| 2003/0169228 | A1 | 9/2003 | Mathiassen et al. |
| 2003/0174871 | A1 | 9/2003 | Yoshioka et al. |
| 2003/0186157 | A1 | 10/2003 | Teraoka et al. |
| 2003/0209293 | A1 | 11/2003 | Sako et al. |
| 2003/0224553 | A1 | 12/2003 | Manansala |
| 2004/0012773 | A1 | 1/2004 | Puttkammer |
| 2004/0017934 | A1 | 1/2004 | Kocher et al. |
| 2004/0021786 | A1 | 2/2004 | Nakamura et al. |
| 2004/0022001 | A1 | 2/2004 | Chu et al. |
| 2004/0042642 | A1 | 3/2004 | Bolle et al. |
| 2004/0050930 | A1 | 3/2004 | Rowe |
| 2004/0066613 | A1 | 4/2004 | Leitao |
| 2004/0076313 | A1 | 4/2004 | Bronstein et al. |
| 2004/0081339 | A1* | 4/2004 | Benkley, III ............... 382/124 |
| 2004/0096086 | A1 | 5/2004 | Miyasaka et al. |
| 2004/0113956 | A1 | 6/2004 | Bellwood et al. |
| 2004/0120400 | A1 | 6/2004 | Linzer |
| 2004/0125993 | A1 | 7/2004 | Zhao et al. |
| 2004/0129787 | A1 | 7/2004 | Saito et al. |
| 2004/0136612 | A1 | 7/2004 | Meister et al. |
| 2004/0155752 | A1 | 8/2004 | Radke |
| 2004/0172339 | A1 | 9/2004 | Snelgrove et al. |
| 2004/0179718 | A1 | 9/2004 | Chou |
| 2004/0184641 | A1 | 9/2004 | Nagasaka et al. |
| 2004/0188838 | A1 | 9/2004 | Okada et al. |
| 2004/0190761 | A1 | 9/2004 | Lee |
| 2004/0208346 | A1 | 10/2004 | Baharav et al. |
| 2004/0208347 | A1 | 10/2004 | Baharav et al. |
| 2004/0208348 | A1 | 10/2004 | Baharav et al. |
| 2004/0213441 | A1 | 10/2004 | Tschudi |
| 2004/0215689 | A1 | 10/2004 | Dooley et al. |
| 2004/0228505 | A1 | 11/2004 | Sugimoto |
| 2004/0228508 | A1 | 11/2004 | Shigeta |
| 2004/0240712 | A1 | 12/2004 | Rowe et al. |
| 2004/0252867 | A1 | 12/2004 | Lan et al. |
| 2005/0031174 | A1 | 2/2005 | Ryhanen et al. |
| 2005/0036665 | A1 | 2/2005 | Higuchi |
| 2005/0047485 | A1 | 3/2005 | Khayrallah et al. |
| 2005/0100196 | A1 | 5/2005 | Scott et al. |
| 2005/0100938 | A1 | 5/2005 | Hoffmann et al. |
| 2005/0103611 | A1 | 5/2005 | Holscher |
| 2005/0109835 | A1 | 5/2005 | Jacoby et al. |
| 2005/0110103 | A1 | 5/2005 | Setlak |
| 2005/0111708 | A1 | 5/2005 | Chou |
| 2005/0123176 | A1 | 6/2005 | Ishii et al. |
| 2005/0129291 | A1 | 6/2005 | Boshra |
| 2005/0136200 | A1 | 6/2005 | Durell et al. |
| 2005/0139656 | A1 | 6/2005 | Arnouse |
| 2005/0139685 | A1 | 6/2005 | Kozlay |
| 2005/0162402 | A1 | 7/2005 | Watanachote |
| 2005/0169503 | A1 | 8/2005 | Howell et al. |
| 2005/0174015 | A1 | 8/2005 | Scott et al. |
| 2005/0210271 | A1 | 9/2005 | Chou et al. |
| 2005/0219200 | A1 | 10/2005 | Weng |
| 2005/0220329 | A1 | 10/2005 | Payne et al. |
| 2005/0231213 | A1 | 10/2005 | Chou et al. |
| 2005/0238212 | A1 | 10/2005 | Du et al. |
| 2005/0244038 | A1 | 11/2005 | Benkley |
| 2005/0244039 | A1 | 11/2005 | Geoffroy et al. |
| 2005/0247559 | A1 | 11/2005 | Frey et al. |
| 2005/0249386 | A1 | 11/2005 | Juh |
| 2005/0258952 | A1 | 11/2005 | Utter et al. |
| 2005/0269402 | A1 | 12/2005 | Spitzer et al. |
| 2006/0006224 | A1 | 1/2006 | Modi |

(56) References Cited

U.S. PATENT DOCUMENTS

| | | |
|---|---|---|
| 2006/0055500 A1 | 3/2006 | Burke et al. |
| 2006/0057756 A1 | 3/2006 | Sato et al. |
| 2006/0066572 A1 | 3/2006 | Yumoto et al. |
| 2006/0078176 A1 | 4/2006 | Abiko et al. |
| 2006/0083411 A1 | 4/2006 | Benkley |
| 2006/0110537 A1 | 5/2006 | Huang et al. |
| 2006/0140461 A1 | 6/2006 | Kim et al. |
| 2006/0144953 A1 | 7/2006 | Takao |
| 2006/0170528 A1 | 8/2006 | Funushige et al. |
| 2006/0181521 A1 | 8/2006 | Perreault et al. |
| 2006/0182319 A1* | 8/2006 | Setlak et al. ............ 382/124 |
| 2006/0187200 A1 | 8/2006 | Martin |
| 2006/0210082 A1 | 9/2006 | Devadas et al. |
| 2006/0214512 A1 | 9/2006 | Iwata |
| 2006/0214767 A1 | 9/2006 | Carrieri |
| 2006/0239514 A1 | 10/2006 | Watanabe et al. |
| 2006/0249008 A1 | 11/2006 | Luther |
| 2006/0259873 A1 | 11/2006 | Mister |
| 2006/0261174 A1 | 11/2006 | Zellner et al. |
| 2006/0267125 A1 | 11/2006 | Huang et al. |
| 2006/0267385 A1 | 11/2006 | Steenwyk et al. |
| 2006/0271793 A1 | 11/2006 | Devadas et al. |
| 2006/0285728 A1 | 12/2006 | Leung et al. |
| 2006/0287963 A1 | 12/2006 | Steeves et al. |
| 2007/0031011 A1 | 2/2007 | Erhart et al. |
| 2007/0036400 A1 | 2/2007 | Watanabe et al. |
| 2007/0057763 A1 | 3/2007 | Blattner et al. |
| 2007/0058843 A1 | 3/2007 | Theis et al. |
| 2007/0067828 A1 | 3/2007 | Bychkov |
| 2007/0076926 A1 | 4/2007 | Schneider et al. |
| 2007/0076951 A1 | 4/2007 | Tanaka et al. |
| 2007/0086634 A1* | 4/2007 | Setlak et al. ............ 382/128 |
| 2007/0090312 A1 | 4/2007 | Stallinga et al. |
| 2007/0138299 A1 | 6/2007 | Mitra |
| 2007/0154072 A1 | 7/2007 | Taraba et al. |
| 2007/0160269 A1 | 7/2007 | Kuo |
| 2007/0180261 A1 | 8/2007 | Akkermans et al. |
| 2007/0196002 A1 | 8/2007 | Choi et al. |
| 2007/0198141 A1 | 8/2007 | Moore |
| 2007/0198435 A1 | 8/2007 | Siegal et al. |
| 2007/0228154 A1 | 10/2007 | Tran |
| 2007/0237366 A1 | 10/2007 | Maletsky |
| 2007/0237368 A1 | 10/2007 | Bjorn et al. |
| 2007/0248249 A1 | 10/2007 | Stoianov |
| 2007/0290124 A1 | 12/2007 | Neil et al. |
| 2008/0002867 A1 | 1/2008 | Mathiassen et al. |
| 2008/0013805 A1 | 1/2008 | Sengupta et al. |
| 2008/0019578 A1 | 1/2008 | Saito et al. |
| 2008/0049987 A1 | 2/2008 | Champagne et al. |
| 2008/0049989 A1 | 2/2008 | Iseri et al. |
| 2008/0063245 A1 | 3/2008 | Benkley et al. |
| 2008/0069412 A1 | 3/2008 | Champagne et al. |
| 2008/0126260 A1 | 5/2008 | Cox et al. |
| 2008/0169345 A1 | 7/2008 | Keane et al. |
| 2008/0170695 A1 | 7/2008 | Adler et al. |
| 2008/0175450 A1 | 7/2008 | Scott et al. |
| 2008/0178008 A1 | 7/2008 | Takahashi et al. |
| 2008/0179112 A1 | 7/2008 | Qin et al. |
| 2008/0185429 A1 | 8/2008 | Saville |
| 2008/0201265 A1 | 8/2008 | Hewton |
| 2008/0205714 A1 | 8/2008 | Benkley et al. |
| 2008/0219521 A1 | 9/2008 | Benkley et al. |
| 2008/0222049 A1 | 9/2008 | Loomis et al. |
| 2008/0223925 A1 | 9/2008 | Saito et al. |
| 2008/0226132 A1 | 9/2008 | Gardner |
| 2008/0238878 A1 | 10/2008 | Wang |
| 2008/0240523 A1 | 10/2008 | Benkley et al. |
| 2008/0240537 A1 | 10/2008 | Yang et al. |
| 2008/0244277 A1 | 10/2008 | Orsini et al. |
| 2008/0267462 A1 | 10/2008 | Nelson et al. |
| 2008/0279373 A1 | 11/2008 | Erhart et al. |
| 2008/0317290 A1 | 12/2008 | Tazoe |
| 2009/0001999 A1* | 1/2009 | Douglas ............ 324/688 |
| 2009/0130369 A1 | 5/2009 | Huang et al. |
| 2009/0140838 A1 | 6/2009 | Newman et al. |
| 2009/0153297 A1 | 6/2009 | Gardner |
| 2009/0154779 A1 | 6/2009 | Satyan et al. |
| 2009/0155456 A1 | 6/2009 | Benkley et al. |
| 2009/0169071 A1 | 7/2009 | Bond et al. |
| 2009/0174974 A1 | 7/2009 | Huang et al. |
| 2009/0212902 A1 | 8/2009 | Haddock |
| 2009/0218698 A1 | 9/2009 | Lam |
| 2009/0237135 A1 | 9/2009 | Ramaraju et al. |
| 2009/0252384 A1 | 10/2009 | Dean et al. |
| 2009/0252385 A1 | 10/2009 | Dean et al. |
| 2009/0252386 A1 | 10/2009 | Dean et al. |
| 2009/0279742 A1 | 11/2009 | Abiko |
| 2009/0319435 A1 | 12/2009 | Little et al. |
| 2009/0324028 A1 | 12/2009 | Russo |
| 2010/0026451 A1 | 2/2010 | Erhart et al. |
| 2010/0045705 A1 | 2/2010 | Vertegaal et al. |
| 2010/0083000 A1 | 4/2010 | Kesanupalli et al. |
| 2010/0117794 A1 | 5/2010 | Adams et al. |
| 2010/0119124 A1 | 5/2010 | Satyan |
| 2010/0123675 A1 | 5/2010 | Ippel |
| 2010/0127366 A1 | 5/2010 | Bond et al. |
| 2010/0176823 A1 | 7/2010 | Thompson et al. |
| 2010/0176892 A1 | 7/2010 | Thompson et al. |
| 2010/0177940 A1 | 7/2010 | Thompson et al. |
| 2010/0180136 A1 | 7/2010 | Thompson et al. |
| 2010/0189314 A1 | 7/2010 | Benkley et al. |
| 2010/0208953 A1 | 8/2010 | Gardner et al. |
| 2010/0244166 A1 | 9/2010 | Shibuta et al. |
| 2010/0272329 A1 | 10/2010 | Benkley |
| 2010/0284565 A1 | 11/2010 | Benkley et al. |
| 2011/0002461 A1 | 1/2011 | Erhart et al. |
| 2011/0018556 A1 | 1/2011 | Le et al. |
| 2011/0083018 A1 | 4/2011 | Kesanupalli et al. |
| 2011/0083170 A1 | 4/2011 | Kesanupalli et al. |
| 2011/0090047 A1 | 4/2011 | Patel |
| 2011/0102567 A1 | 5/2011 | Erhart |
| 2011/0102569 A1 | 5/2011 | Erhart |
| 2011/0175703 A1 | 7/2011 | Benkley |
| 2011/0176037 A1 | 7/2011 | Benkley |
| 2011/0182486 A1 | 7/2011 | Valfridsson et al. |
| 2011/0221942 A1 | 9/2011 | Taura |
| 2011/0298711 A1 | 12/2011 | Dean et al. |
| 2011/0304001 A1 | 12/2011 | Erhart et al. |
| 2012/0044639 A1 | 2/2012 | Garcia |
| 2012/0148122 A1 | 6/2012 | Dean |
| 2012/0189166 A1 | 7/2012 | Russo |
| 2012/0189172 A1 | 7/2012 | Russo |
| 2012/0206586 A1 | 8/2012 | Gardner |
| 2012/0256280 A1 | 10/2012 | Ehart |
| 2012/0257032 A1 | 10/2012 | Benkley |
| 2012/0308092 A1 | 12/2012 | Benkley et al. |
| 2013/0021044 A1 | 1/2013 | Thompson et al. |
| 2013/0094715 A1 | 4/2013 | Benkley et al. |
| 2013/0177220 A1 | 7/2013 | Erhart et al. |

FOREIGN PATENT DOCUMENTS

| | | | |
|---|---|---|---|
| EP | 0791899 | A3 | 8/1997 |
| EP | 0791899 | B1 | 8/1997 |
| EP | 0929028 | A2 | 1/1998 |
| EP | 0973123 | A1 | 1/2000 |
| EP | 1018697 | A2 | 7/2000 |
| EP | 1139301 | A2 | 10/2001 |
| EP | 1531419 | A2 | 5/2005 |
| EP | 1533759 | A1 | 5/2005 |
| EP | 1536368 | A1 | 6/2005 |
| EP | 1538548 | A2 | 6/2005 |
| EP | 1624399 | B1 | 2/2006 |
| EP | 1775674 | A1 | 4/2007 |
| EP | 1939788 | A1 | 7/2008 |
| GB | 2331613 | A | 5/1999 |
| GB | 2480919 | | 12/2011 |
| GB | 2487661 | A1 | 8/2012 |
| GB | 2489100 | A | 9/2012 |
| GB | 2490192 | | 10/2012 |
| GB | 2474999 | B | 2/2013 |
| JP | 01094418 | A2 | 4/1989 |
| JP | 04158434 | A2 | 6/1992 |
| JP | 2003256820 | A | 9/2003 |

(56) References Cited

FOREIGN PATENT DOCUMENTS

| | | |
|---|---|---|
| JP | 2005011002 A | 1/2005 |
| JP | 2005242856 | 9/2005 |
| JP | 2006053768 | 6/2006 |
| JP | 2007305097 A | 11/2007 |
| JP | 3569804 B2 | 9/2009 |
| TW | 200606745 A | 2/2006 |
| TW | 200606746 | 2/2006 |
| TW | 200614092 | 5/2006 |
| TW | 200617798 | 6/2006 |
| TW | 200620140 A | 6/2006 |
| TW | 200629167 A | 8/2006 |
| WO | WO 90/03620 A1 | 4/1990 |
| WO | WO 98/58342 A1 | 12/1998 |
| WO | WO 99/028701 A1 | 6/1999 |
| WO | WO 99/043258 A1 | 9/1999 |
| WO | WO 9946724 A1 | 9/1999 |
| WO | WO 01/22349 A1 | 3/2001 |
| WO | WO 01/59558 A1 | 8/2001 |
| WO | WO 01/94902 A2 | 12/2001 |
| WO | WO 01/94902 A3 | 12/2001 |
| WO | WO 02/47018 A2 | 6/2002 |
| WO | WO 02/47018 A3 | 6/2002 |
| WO | WO 02/061668 A1 | 8/2002 |
| WO | WO 02/077907 A1 | 10/2002 |
| WO | WO 03/063054 A2 | 7/2003 |
| WO | WO 03/075210 A2 | 9/2003 |
| WO | WO 2004/066194 A1 | 8/2004 |
| WO | WO 2004/066693 A1 | 8/2004 |
| WO | WO 2005/0104012 A1 | 11/2005 |
| WO | WO 2005/106774 A2 | 11/2005 |
| WO | WO 2005/106774 A3 | 11/2005 |
| WO | WO 2006/040724 A1 | 4/2006 |
| WO | WO 2006/041780 A1 | 4/2006 |
| WO | WO 2007/011607 A1 | 1/2007 |
| WO | WO 2008/033264 A2 | 3/2008 |
| WO | WO 2008/033264 A3 | 3/2008 |
| WO | WO 2008/033265 A2 | 6/2008 |
| WO | WO 2008/033265 A3 | 6/2008 |
| WO | WO 2008/137287 A1 | 11/2008 |
| WO | WO 2009/002599 A2 | 12/2008 |
| WO | WO 2009/002599 A3 | 12/2008 |
| WO | WO 2009/029257 A1 | 6/2009 |
| WO | WO 2009/079219 A1 | 6/2009 |
| WO | WO 2009/079221 A2 | 6/2009 |
| WO | WO 2009/079257 A1 | 6/2009 |
| WO | WO 2009/079262 A1 | 6/2009 |
| WO | WO 2010/034036 A1 | 3/2010 |
| WO | WO 2010/036445 A1 | 4/2010 |
| WO | WO 2010/143597 A1 | 12/2010 |
| WO | WO 2011/088248 A1 | 1/2011 |
| WO | WO/2011/088252 A1 | 1/2011 |
| WO | WO 2011/053797 | 5/2011 |

OTHER PUBLICATIONS

Maltoni, "Handbook of Fingerprint Recognition", XP002355942 Springer, New York, USA, Jun. 2003 pp. 65-69.

Vermasan, et al., "A500 dpi AC Capacitive Hybrid Flip-Chip CMOS ASIC/Sensor Module for Fingerprint, Navigation, and Pointer Detection With On-Chip Data Processing", IEEE Journal of Solid State Circuits, vol. 38, No. 12, Dec. 2003, pp. 2288-2294.

Ratha, et al. "Adaptive Flow Orientation Based Feature Extractionin Fingerprint Images," Pattern Recognition, vol. 28 No. 11, 1657-1672, Nov. 1995.

Ratha, et al., "A Real Time Matching System for Large Fingerprint Databases," IEEE, Aug. 1996.

Suh, et al., "Design and Implementation of the AEGIS Single-Chip Secure Processor Using Physical Random Functions", Computer Architecture, 2005, ISCA '05, Proceedings, 32nd International Symposium, Jun. 2005 (MIT Technical Report CSAIL CSG-TR-843, 2004.

Rivest, et al., "A Method for Obtaining Digital Signatures and Public-Key Cryptosystems", Communication of the ACM, vol. 21 (2), pp. 120-126. (1978).

Hiltgen, et al., "Secure Internet Banking Authentication", IEEE Security and Privacy, IEEE Computer Society, New York, NY, US, Mar. 1, 2006, pp. 24-31, XP007908655, ISSN: 1540-7993.

Hegt, "Analysis of Current and Future Phishing Attacks on Internet Banking Services", Mater Thesis. Techische Universiteit Eindhoven—Department of Mathematics and Computer Science May 31, 2008, pp. 1-149, XP002630374, Retrieved from the Internet: URL:http://alexandria.tue.nl/extral/afstversl/wsk-i/hgt2008.pdf [retrieved on Mar. 29, 2011] pp. 127-134, paragraph 6.2.

Gassend, et al., "Controlled Physical Random Functions", In Proceedings of the 18th Annual Computer Security Conference, Las Vegas, Nevada, Dec. 12, 2002.

Bellagiodesigns.Com (Internet Archive Wayback Machine, www.bellagiodesigns.com date: Oct. 29, 2005).

Closed Loop Systems, The Free Dictionary, http://www.thefreedictionary.com/closed-loop+system (downloaded Dec. 1, 2011).

Feedback: Electronic Engineering, Wikipedia, p. 5 http://en.wikipedia.org/wiki/Feedback#Electronic_engineering (downloaded Dec. 1, 2011).

Galy et al. (Jul. 2007) "A full fingerprint verification system for a single-line sweep sensor." IEEE Sensors J., vol. 7 No. 7, pp. 1054-1065.

* cited by examiner

APPARATUS AND METHOD FOR ELECTROSTATIC DISCHARGE PROTECTION

BACKGROUND

Electrostatic discharge (ESD) is a serious problem for many types of solid state electronics, such as integrated circuits (ICs). Electronic components such as ICs can be exposed to ESD from various different sources, such as the human body, assembly equipment, or basic packaging materials. Contact between the sources and a grounded IC can generate large enough currents through the IC to significantly damage its internal circuitry.

The effects of ESD create special problems with touch electronics, i.e., electronics intended for touching by the body. For example, electronic fingerprint sensors allow a user to swipe or press a finger over some portion of the circuit in order to read the user's fingerprint. It would be impractical or inconvenient for a user to have to ground his or her body prior to touching the sensor in order to dissipate an electrostatic charge.

Conventional fingerprint sensors include a silicon chip with an exposed surface for receiving human touch. These fingerprint sensors can be easily damaged physically or mechanically because of the exposed surface, reducing the durability and/or reliability of the sensor. The conventional fingerprint sensors as well as newer, more advanced "flexible" fingerprint sensors, which enable a user to swipe a finger across a polyimide surface without directly contacting the sensor circuitry, are both susceptible to ESD damage. For example, electrostatic charge can build up on the polyimide surface of the flexible fingerprint sensor as a user swipes his or her finger. This charge can continue to increase in potential until the path of least resistance is found and the charge dissipated. In certain cases, the charge can discharge to the sensor circuitry, causing damage to sensitive electronic components such as IC input/output cells.

The current ESD protection used in the fingerprint sensor industry uses a metal ring surrounding the perimeter of the sensor. This arrangement requires an additional metal layer in the sensor manufacture, thus increasing the cost of the sensor. The inventions disclosed herein teach a new kind of ESD protection for touch electronics that reduces the manufacture cost and increase the durability of the electronics.

SUMMARY

Some embodiments of the invention provide a substrate capable of receiving electrostatic discharge. The substrate includes an edge surface including at least one plated castellation capable of conducting the electrostatic discharge. The substrate also includes a bottom surface, a top surface, and a circuit trace along at least one of the bottom surface and the top surface, the circuit trace electrically connected to the at least one plated castellation.

Some embodiments of the invention provide a method of constructing a substrate with electrostatic discharge protection. The method includes providing a substrate array including a plurality of substrates, punching holes along at least a portion of a perimeter of each of the plurality of substrates, and plating the holes with a conductive material. The method also includes cutting each of the plurality of substrates along cut lines that bisect at least some of the holes and connecting the conductive material on each of the plurality of substrates to a known potential.

DETAILED DESCRIPTION

Figure 1:
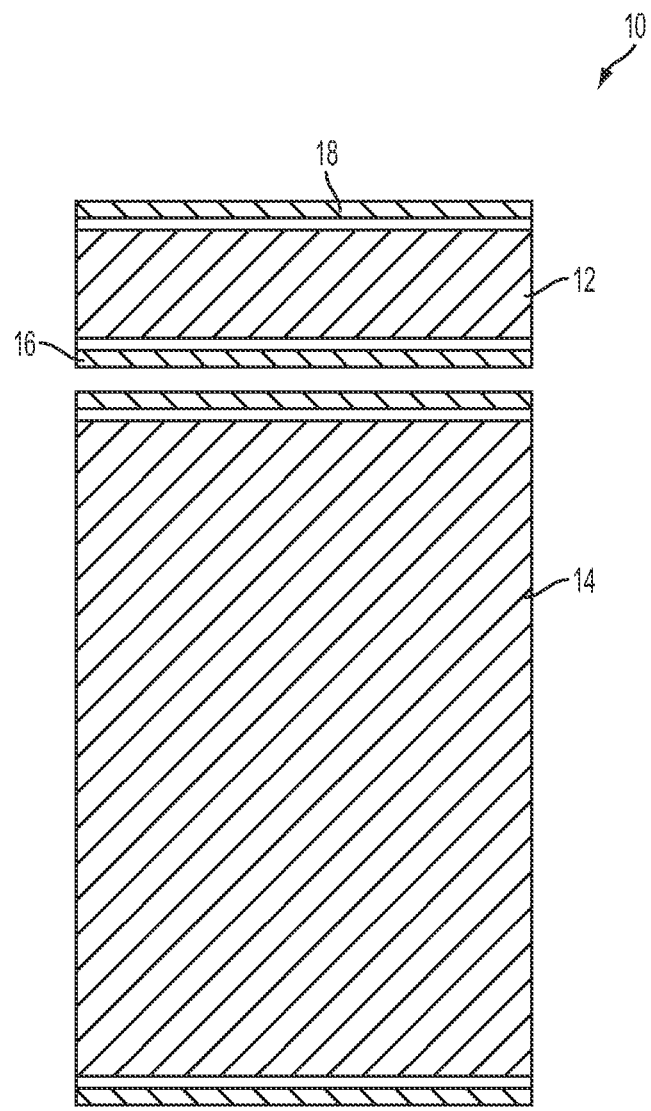
FIG. 1 is a side view of a fingerprint sensing circuit according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

FIG. 1 illustrates a fingerprint sensing circuit 10 according to one embodiment of the invention. The fingerprint sensing circuit 10 can have a two-substrate architecture including a top substrate 12 and a bottom substrate 14. The top substrate 12 can be constructed of a flexible or rigid material suitable for applying a circuit thereon. In one embodiment, the top substrate 12 can be constructed of a flexible polyimide material, such as Kapton®, with a thickness of between about 5 and about 100 micrometers. The bottom substrate 18 can be a conventional printed circuit board (PCB).

Figure 2:
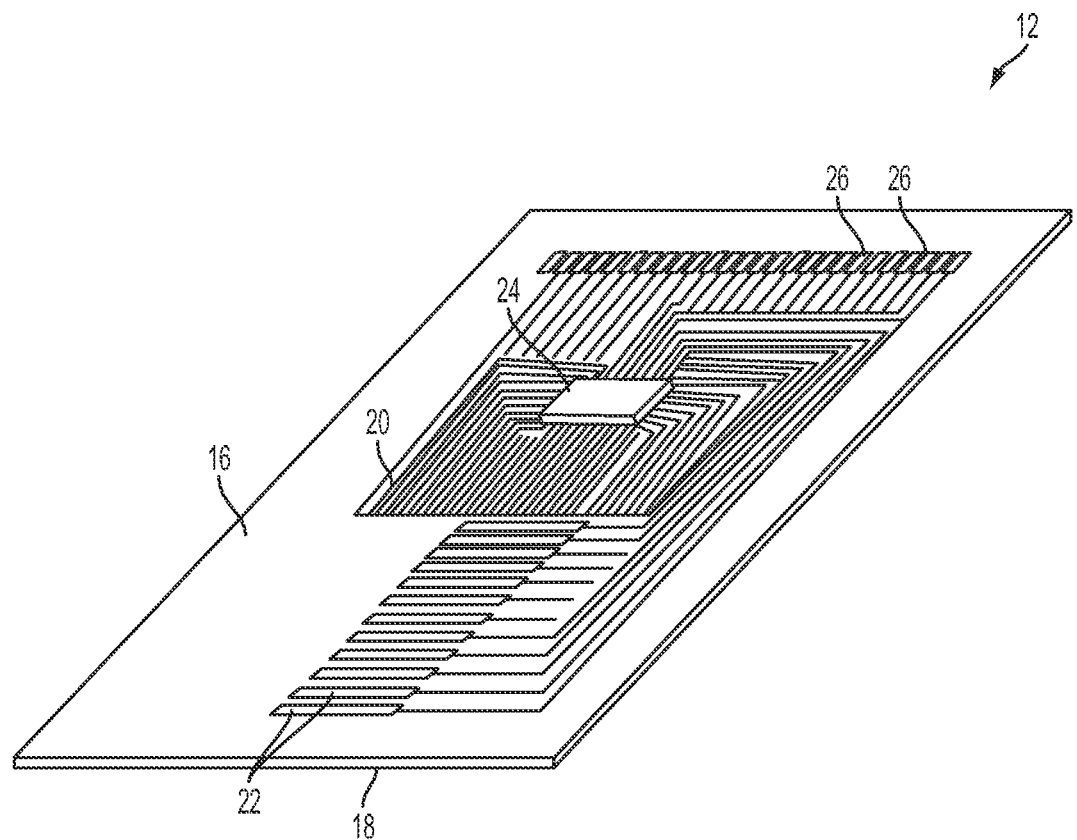
FIG. 2 is a perspective bottom view of a top substrate of the fingerprint sensing circuit of FIG. 1.
Figure 3:
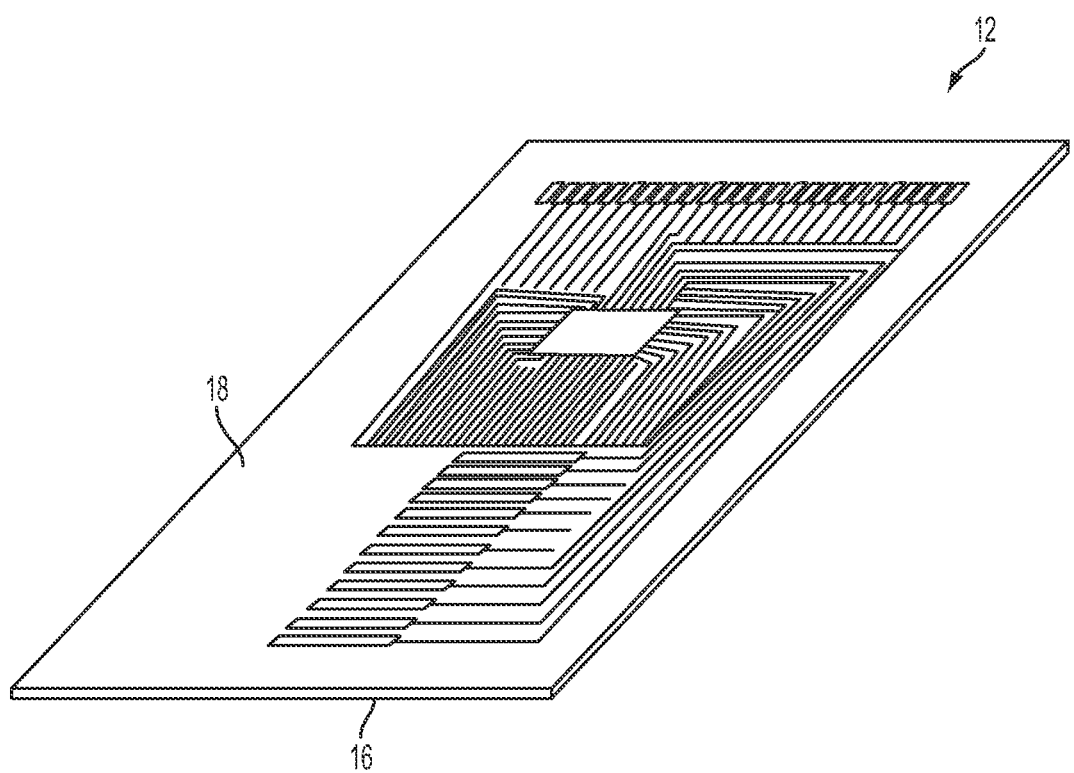
FIG. 3 is a perspective top view of a top substrate of the fingerprint sensing circuit of FIG. 1.

FIGS. 2 and 3 illustrate the top substrate 12. The top substrate 12 can have a circuit side 16, as shown in FIG. 2, and a sensing side 18, as shown in FIG. 3. The circuit side 16 of the top substrate 12 can be attached to the bottom substrate 14 via a chip-on-flex (COF) process, wire bonding, anisotropic conductive film (ACF), etc.

In some embodiments, the fingerprint sensing circuit 10 can include an image sensor 20 to detect the ridges and valleys of a fingerprint as a finger moves across the image sensor 20. The fingerprint sensing circuit 10 can also include a velocity sensor 22 to detect the speed of a finger moving across the image sensor 20. The image sensor 20 and/or the velocity sensor 22 can be bonded to the circuit side 16 of the fingerprint sensing circuit 10. For example, the image sensor 20 and/or the velocity sensor 22 can be constructed of conductive traces (e.g., copper traces) printed or applied to the circuit side 16 using a lithographic technique, as shown in FIG. 2. In some embodiments, the image sensor 20 can be implemented as an array of capacitive sensors capable of sensing the ridges and valleys of a finger as it travels over the sensor 20. In addition, the velocity sensor 22 can be implemented using two or more capacitive detectors at intervals along the direction of travel of the finger.

Fingerprint information sensed by the image sensor 20 and the velocity sensor 22 can be transmitted to one or more sensor integrated circuits (ICs) 24 connected to the circuit side 16 of the top substrate 12. The sensor IC 24 can be bonded to the top substrate 12 using a suitable technique such as a chip-on-flex (COF) process, wirebond, flip chip, anisotropic conductive film (ACF) adhesive, underfil, glob-top, etc. The sensor IC 24 can include drive and sense electronics for interpreting the fingerprint information from the image sensor 20 and the velocity sensor 22. In one embodiment, the sensor IC 24 can be a silicon chip or die. In addition, in some embodiments, the image sensor 20 and the velocity sensor 22 can be contained within the sensor IC 24 (e.g., rather than being positioned external to the sensor IC 24, as described above).

During use, a user's finger can be swiped along the sensing side 18 of the top substrate 12. On the circuit side 16 of the top substrate 12, the image sensor 20 and the velocity sensor 22 can detect changes in capacitance as the finger is swiped. As a result of having a separate sensing side 18 and circuit side 16, the top substrate 12 can substantially electrically and mechanically isolate the user's finger from the image sensor 20, the velocity sensor 22, and the sensor IC 24, thereby providing some degree of protection from electrostatic discharge (ESD) and mechanical abrasion.

Figure 4:
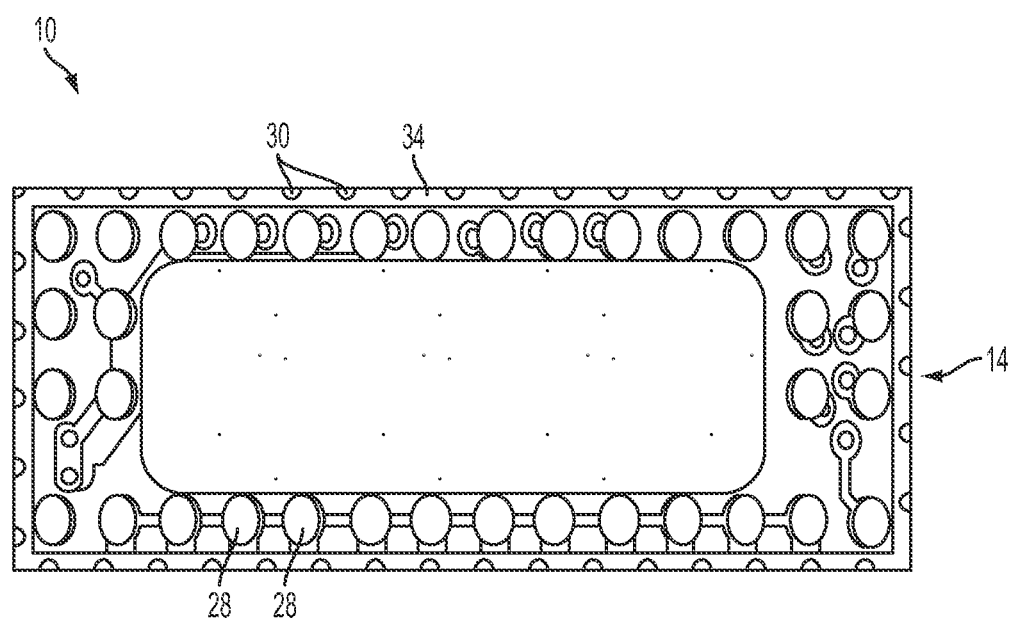
FIG. 4 is a bottom view of a bottom substrate of the fingerprint sensing circuit of FIG. 1.

In some embodiments, the top substrate 12 can include interconnect pads 26 that allow the sensor IC 24 to interface with the bottom substrate 14. The bottom substrate 14 can include, for example, power supply circuitry, external communication circuitry, etc. for the sensor IC 24. FIG. 4 illustrates the bottom substrate 14 according to one embodiment of the invention. As shown in FIG. 4, the underside of the bottom substrate 14 can include a ball grid array (BGA) 28 to electrically connect the fingerprint sensing circuit 10 to a substrate of a product.

In one embodiment, the fingerprint sensing circuit 10 can have a single-substrate architecture, where the single substrate has a sensing side and an opposite circuit side. Thus, the substrate can include a sensor IC on its circuit side and a user's finger can be swiped along the opposite, or sensing side. As the user's finger is swiped along the sensing side, the sensor IC, with separate or integral image and velocity sensors, can detect the user's fingerprint through the substrate using techniques such as capacitive, thermal, radio frequency (RF), infrared (IR), light-gathering, and/or ultrasonic techniques. The single substrate can also include other circuitry, such as power supply circuitry, external communications circuitry, etc. on its circuit side.

In another embodiment, the fingerprint sensing circuit 10 can have a single-substrate architecture, where the single substrate has a combined circuit and sensing side. Thus, the substrate can include a sensor IC on the same side that the user's finger is swiped. An epoxy "glob-top" over the sensing side can protect the sensor IC from mechanical damage and/or contamination. The sensor IC, including an integral image sensor and/or a velocity sensor, can sense and collect fingerprint information by coming in direct contact with the user's finger through the epoxy. The sensor IC can detect the user's fingerprint using techniques such as capacitive, thermal, RF, IR, light-gathering and/or ultrasonic techniques.

In yet another embodiment, the fingerprint sensing circuit 10 can have a single-substrate or two-substrate architecture, where both sides of the top substrate can include sensing circuitry. The top substrate can include an image sensor and a velocity sensor on the sensing side (i.e., same side that the user's finger is swiped). An epoxy glob-top or an ink layer can be applied over the sensing side to protect the image sensor and the velocity sensor from mechanical damage and/or contamination. The sensor IC can be applied to the opposite, circuit side. The image sensor and the velocity sensor can sense fingerprint information by coming in direct contact with the user's finger through the epoxy or ink layer and transmit the fingerprint information to the sensor IC through, for example, RF transmissions. Other circuitry, or a bottom substrate, can also be coupled to the circuit side of the top substrate.

In some embodiments, the one or more substrates of the fingerprint sensing circuit 10 (i.e., the substrate of the single-substrate architecture or one or both of the substrates of the two-substrate architecture) can include a plated portion around its outside edge surface. The plated portion can be plated with a conductive plating (e.g., copper, aluminum, gold, nickel, etc.) and can be connected to a circuit trace along a top, bottom, or inner surface of the one or more substrates. The circuit trace can be connected to a low impedance path to a known potential, such as power source ground. As a result, the outside edge of the one or more substrates can allow a controlled path for ESD to be removed from the fingerprint sensing circuit 10 (i.e., from the plated portion, along the circuit trace, to power source ground).

For example, ESD can build up on the sensing side as a user swipes his or her finger. This charge can continue to increase in potential until the path of least resistance is found and the charge dissipated. The plated outside edge and the circuit trace can create the shortest discharge path for ESD, thus preventing ESD from discharging to the sensor IC or any other components of the circuit side or bottom substrate and potentially damaging them. In some embodiments, the plated portion can completely surround the outside edge of the one or more substrates. In other embodiments, the plated portion can partially surround the outside edge of the one or more substrates. In addition, the plated portion can extend down the entire thickness, or only a portion of the thickness, of the outside edge of the one or more substrates.

Figure 5:
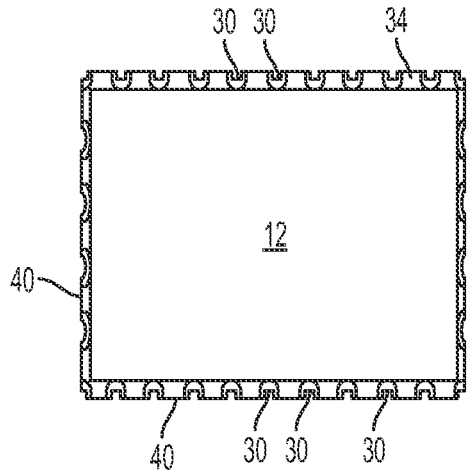
FIG. 5 is a top view of a top substrate of the fingerprint sensing circuit of FIG. 1.
Figure 6A:
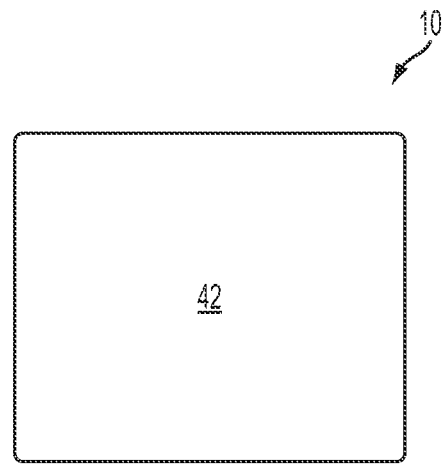
FIG. 6A is a top view of the fingerprint sensing circuit of FIG. 1.
Figure 6B:
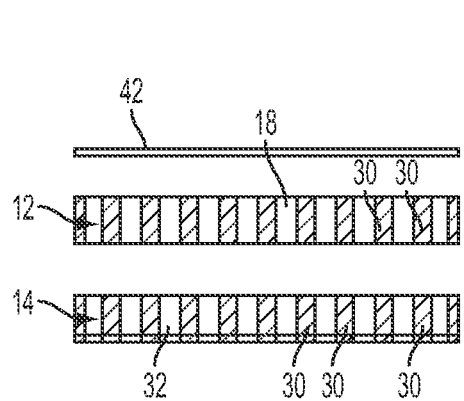
FIG. 6B is an exploded side view of the fingerprint sensor of FIG. 1.
Figure 6C:
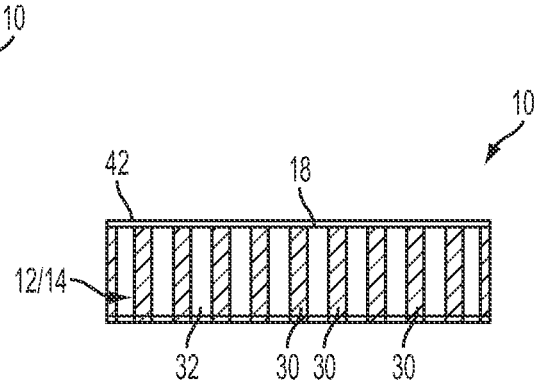
FIG. 6C is another side view of the fingerprint sensing circuit of FIG. 1.

In one embodiment, the plated portion can be in the form of plated castellations 30, or perforations. For example, FIGS. 4-6C illustrate a fingerprint sensing circuit with the two-substrate architecture according to one embodiment of the invention. As shown in FIGS. 6B and 6C, the substrates 12, 14 can include the plated castellations 30 down their outside edge surfaces 32. The castellations 30 can be interconnected by a circuit trace 34 along a top surface of the top substrate 12, as shown in FIG. 5, and/or a bottom surface of the bottom substrate 12, as shown in FIG. 4. The circuit trace 34 can be connected to power source ground. As a result, the plated castellations 30 and the circuit trace can create the shortest discharge path for ESD. In one embodiment, each of the plated castellations 30 can be directly connected to power source ground, rather than interconnected through the circuit trace.

In some embodiments, the castellations 30 can completely surround the outside edge 32 of one or both of the substrates 12, 14 at a constant or varying pitch. In other embodiments, the castellations 30 can partially surround the outside edge 32 of one or both of the substrates 12, 14. FIGS. 4 and 5 illustrate the castellations with a smooth, semi-circular cross-section. In other embodiments, the castellations can have semi-circular, semi-square, semi-rectangular, and/or semi-triangular cross-sections.

Figure 7:
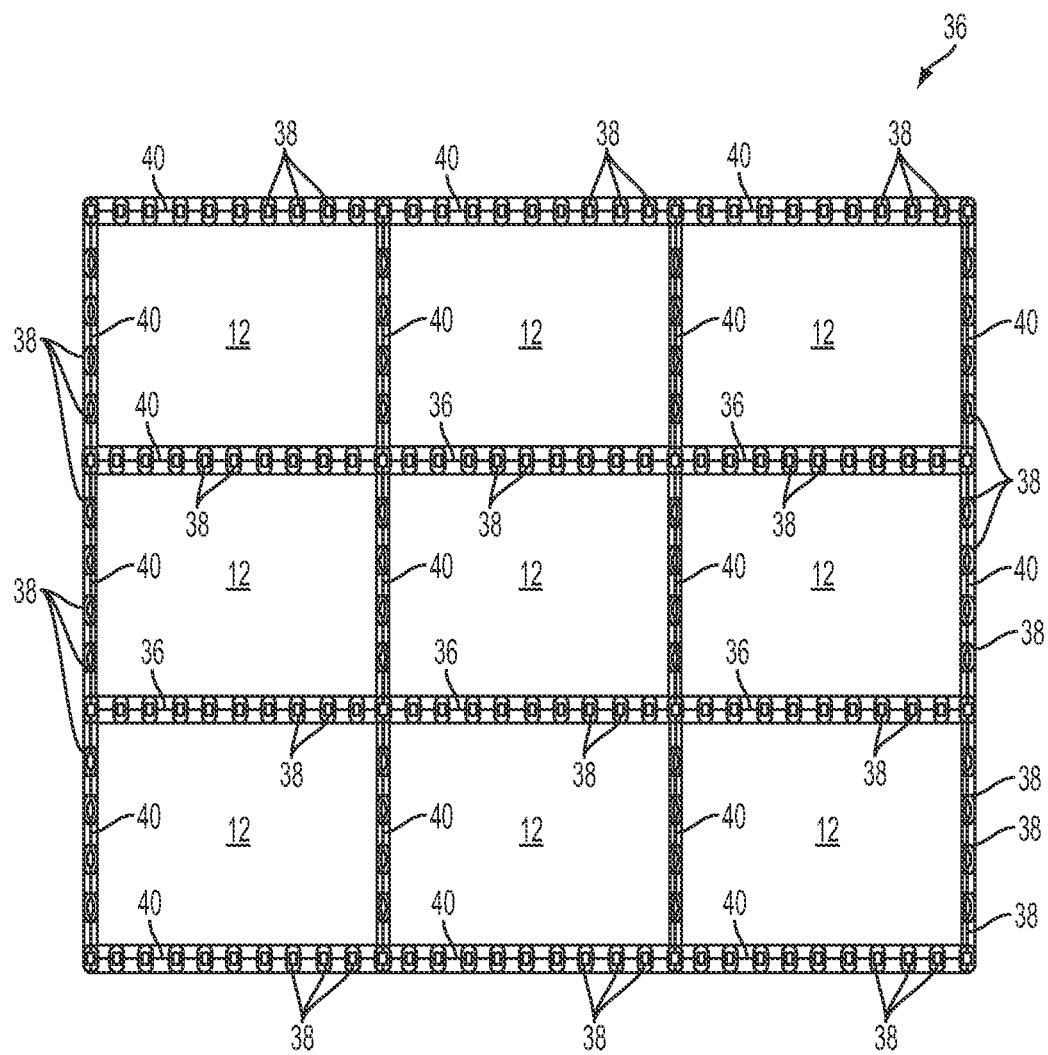
FIG. 7 is a top view of a substrate array for use with a fingerprint sensing circuit according to one embodiment of the invention.

In some embodiments, multiple substrates can be created from a single substrate array 36. For example, FIG. 7 illustrates a substrate array 36 including nine separate substrates 12 (and/or substrates 14) for nine fingerprint sensing circuits 10. As shown in FIG. 7, prior to stamping out individual substrates 12, via holes 38 can be punched around a perimeter of each substrate 12 and plated. In some embodiments, the via holes 38 can be punched and plated around only a portion of the perimeter of each substrate 12 (not shown). In addition, the via holes 38 can be all through holes, all blind holes, or some combination of through holes and blind holes. Further, the via holes 38 can have a circular cross-section, as shown in FIG. 7, or a square, rectangular, and/or triangular cross-section.

After the via holes 38 have been punched and plated around each perimeter, the substrates 12 can be cut or stamped out. Cut lines 40 made by the cutting or stamping mechanism can divide the via holes 38, thereby creating the castellations 30, as shown in FIG. 5. Accordingly, each castellation 30 can be a fraction of a via hole 38. For example, FIG. 5 shows some castellations 30 created from via holes 38 that have been bisected and some castellations 30 created from via holes 38 that have been quartered (e.g., at corners of the substrate 12). After the via holes 38 are punched, and before or after the substrates 12 are stamped from the substrate array 36, other layers or coatings 42, such as an epoxy glob-top or an ink layer, can be coupled to the substrate 12, as shown in FIGS. 6A-6C. When the fingerprint sensing circuit 10 is viewed from above, as shown in FIG. 6A, the coating 42 can substantially hide the castellations 30.

The fingerprint sensing circuits 10 described above can be applied to products other than fingerprint sensors, such as sensing circuits for touchpads and molded plastics having a variety of shapes and contours. In addition, the plated outside edge or castellation method described above can be applied to various other devices to protect circuitry from ESD. For example, the plated outside edge or castellation method can be used to protect sensitive circuitry associated with devices intended for human touch, including but not limited to PCBs for touch pads, touch screens, touch panels, keyboards, keypads, mice, joysticks, trackballs, etc., which can be collectively referred to as "touch electronics circuits" herein.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A biometric sensor comprising:
 a flexible substrate comprising a sensing side surface and a sensing element side surface opposing the sensing side surface;
 a biometric sensor portion comprising biometric image sensing elements formed on the sensing element side surface forming at least part of a biometric sensor array sensing capacitively induced changes induced by a biometric in the vicinity of the biometric image sensing elements;
 a biometric sensor controller integrated circuit mounted to the flexible substrate on the sensing side surface of the flexible substrate;
 an edge surface of the flexible substrate including at least one conductively plated perforation in the flexible substrate; and
 an electro-static discharge element formed on or as part of the flexible substrate and electrically connected to the at least one conductively plated perforation.

2. The sensor of claim 1 wherein the at least one conductively plated perforation is plated with a conductive material including one of copper, aluminum, nickel, and gold.

3. The sensor of claim 1 wherein the at least one conductively plated perforation comprises a plurality of conductively plated perforations positioned on the periphery of the flexible substrate.

4. The sensor of claim 3 wherein at least one of the plurality of conductively plated perforations is electrically connected to a known potential.

5. The sensor of claim 1 further comprising at least one biometric image sensing element formed on the sensing side surface of the flexible substrate remote from the biometric sensor controller integrated circuit and electrically coupled to the biometric sensor controller integrated circuit, wherein the at least one biometric image sensing element transmits information to the biometric sensor controller integrated circuit.

6. The sensor of claim 5 wherein the biometric comprises a fingerprint.

7. The sensor of claim 6 wherein the sensing side surface provides an area for a finger to be swiped.

8. A method of constructing a biometric sensor comprising:
 providing a flexible substrate comprising a sensing side surface and a sensing element side surface opposing the sensing side surface;
 providing a biometric sensor portion comprising biometric image sensing elements formed on the sensing element side surface forming at least part of a biometric sensor array sensing capacitively induced changes induced by a biometric in the vicinity of the biometric image sensing elements;
 providing a biometric sensor controller integrated circuit mounted to the flexible substrate on the sensing side surface of the flexible substrate;
 punching via holes at least partially through the flexible substrate along at least a portion of a perimeter of the flexible substrate;
 plating the via holes with a conductive material; and electrically connecting the plating of at least some of the vias holes to an electrostatic discharge element formed on or as part of the flexible substrate.

9. The method of claim 8 and further comprising the electrostatic discharge element comprising an electric trace element formed on one of the sensing side or the sensing element side of the flexible substrate.

10. The method of claim 9 and further comprising the electric trace element connected to a power source ground.

11. The method of claim 8 and further comprising electrically connecting a sensor controller integrated circuit to one of the sensing side or the sensing element side of the flexible substrate.

12. The method of claim 8 and further comprising attaching the flexible substrate to another substrate having a ball grid array on a bottom surface of the another substrate.

13. The method of claim 8 wherein the via holes are punched along the entire perimeter of flexible substrate.

14. The method of claim 12 wherein the flexible substrate and the another substrate are coupled together.

15. A method of constructing a biometric sensor having electrostatic discharge protection, the method comprising:
    providing a flexible substrate comprising a sensing side surface and a sensing element side surface opposing the sensing side surface;
    providing a biometric sensor portion comprising biometric image sensing elements formed on the sensing element side surface forming at least part of a biometric sensor array sensing capacitively induced changes induced by a biometric in the vicinity of the biometric image sensing elements;
    providing a biometric sensor controller integrated circuit mounted to the flexible substrate on the sensing side surface of the flexible substrate;
    punching holes along at least a portion of a perimeter of the flexible substrate and at least partially through the flexible substrate;
    plating the holes with a conductive material;
    electrically connecting the plating of at least some of the vias holes to an electrostatic discharge element formed on or as part of the flexible substrate;
    cutting each of the plurality of substrates along cut lines that bisect at least some of the holes; and
    connecting the electrostatic discharge element to a known potential.

16. The method of claim 15 and further comprising the electrostatic discharge element connecting the conductive material to a known potential comprising an electric trace element formed in or on the flexible substrate.

17. The method of claim 15 and further comprising the biometric comprising a fingerprint from a finger of a user placed in the vicinity of the sensing side surface of the flexible substrate.

18. The method of claim 15 wherein the holes are punched along one side of a perimeter of the flexible substrate.

19. The apparatus of claim 1 further comprising:
    the biometric comprising a fingerprint from a finger of a user placed or swiped in the vicinity of the sensing side surface of the flexible substrate.

20. The method of claim 8 further comprising:
    the biometric comprising a fingerprint from a finger of a user placed or swiped in the vicinity of the sensing side surface of the flexible substrate.

* * * * *